United States Patent [19]

Goodman et al.

[11] 4,366,495
[45] Dec. 28, 1982

[54] VERTICAL MOSFET WITH REDUCED TURN-ON RESISTANCE

[75] Inventors: Lawrence A. Goodman, Plainsboro, N.J.; Kenneth P. Smith, Aloha, Oreg.

[73] Assignee: RCA Corporation, New York, N.Y.

[21] Appl. No.: 63,809

[22] Filed: Aug. 6, 1979

[51] Int. Cl.³ .............................. H01L 29/78
[52] U.S. Cl. ........................ 357/23; 357/22
[58] Field of Search ............ 357/23, 23 VD, 22

[56] References Cited

U.S. PATENT DOCUMENTS

| 3,891,479 | 6/1975 | Zwernemann | 148/175 |
| 4,070,690 | 1/1978 | Wickstrom | 357/23 VD |
| 4,101,922 | 7/1978 | Tihanyi | 357/23 VD |
| 4,115,793 | 9/1981 | Nishizawa | 357/22 |
| 4,145,700 | 3/1979 | Jambotkar | 357/23 |

OTHER PUBLICATIONS

*Electronics*, Oct. 13, 1969, p. 207.

*Primary Examiner*—Martin H. Edlow
*Attorney, Agent, or Firm*—Birgit E. Morris; Donald S. Cohen; Kenneth R. Glick

[57] ABSTRACT

A vertical MOSFET structure which includes a drain which comprises a high conductivity region and a low conductivity region. The high conductivity drain region is contoured so as to minimize the device turn-on resistance without degrading the device breakdown voltage.

9 Claims, 3 Drawing Figures

VERTICAL MOSFET WITH REDUCED TURN-ON RESISTANCE

BACKGROUND OF THE INVENTION

The present invention relates generally to insulated gate field effect transistors (IGFETS) such as metal oxide semiconductor FETs (MOSFETs), and more particularly to vertical double diffused MOSFETS (VDMOS).

A conventional IGFET is a unipolar transistor in which current flows from a source region, through a channel in a body region, to a drain region. The channel can be induced (in an enhancement type device) or removed (in a depletion type device) by means of an electrostatic field produced by charges on a nearby gate electrode. In a MOSFET device the gate electrode is insulated from the semiconductor surface by an oxide layer. The gate typically lies between source and drain electrodes (disposed, respectively, on the source and drain regions) on a planar surface of the semiconductor substrate.

In a VDMOS structure, the drain electrode is on the opposite semiconductor surface from the gate and source electrodes, (although the drain region itself typically extends through the semiconductor, from an area adjacent to the body region on the first surface, to the drain electrode on the second surface). In VDMOS operation the channel occurs in the body region near the gate electrode (on the first surface). Current flows essentially horizontally (parallel to the first surface), from the source, through the channel region in the body, to the drain region, and then vertically (perpendicular to the first surface) through the drain region to the drain electrode (on the second surface).

The source-drain breakdown voltage of such a device is inversely proportional to the charge carrier concentration (ie-dopant level) in the drain region. Therefore, to increase device breakdown voltage, that portion of the drain region which is adjacent to the body region generally comprises lower conductivity semiconductor material (i.e., containing fewer charge carriers) than the remaining portion of the drain region. However, this has the detrimental effect of increasing the device turn-on resistance, because the conductivity of the region through which the charge carriers must travel is relatively low. The present invention is directed towards minimizing the resistance of the VDMOS drain region in selected areas so as to enhance device turn-on without degrading other device parameters, such as breakdown voltage.

SUMMARY OF THE INVENTION

A VDMOS structure wherein the conductivity profile of the drain region is contoured so as to minimize turn-on resistance without affecting device breakdown voltage.

DETAILED DESCRIPTION

Figure 1:
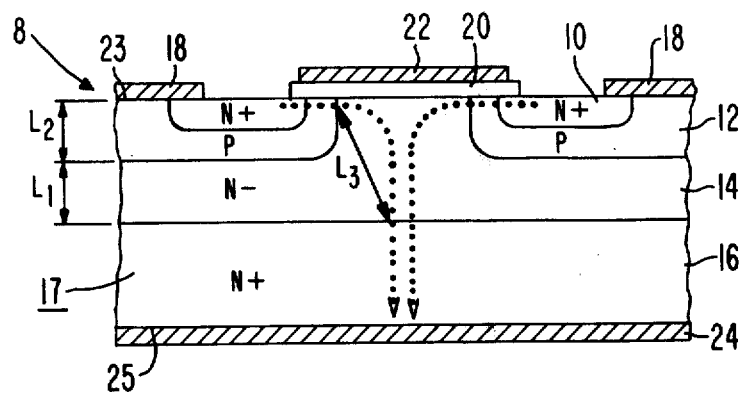
FIG. 1 is a cross-sectional view of a conventional VDMOS device.

Referring to FIG. 1, a conventional VDMOS device 8, having adjacent source 10, body 12, extended drain 14, and high conductivity drain 16 regions in a semiconductor wafer 17, is shown. The source, high conductivity drain and extended drain regions are of a particular conductivity type (for example, N) and the body is of opposite conductivity type (for example, P). Source and gate electrodes (18 and 22, respectively) are disposed on a first surface 23 of the semiconductor and a drain electrode 24 is disposed on the opposite surface 25. The gate electrode 22 is typically spaced from the semiconductor surface by an oxide layer 20. When turned on (by a voltage applied to the gate electrode 22), current flows from the source electrode 18, through a channel induced under the gate electrode 22, to the drain electrode 24; as represented by the dotted lines.

The device is typically fabricated by epitaxially growing the extended drain region 14 onto a substrate of a particular conductivity type (shown here as the high conductivity drain 16), and then diffusing the body 12 and source 10 regions into the extended drain 14 (hence the term double diffusion). The depth of the body region (from the first surface 23) is indicated by the dimension $L_2$. The thickness of the extended drain 14 between the body 12 and high conductivity drain 16 is indicated as $L_1$.

As illustrated, the path of charge carriers through the device 8 has both horizontal and vertical components. The path is substantially horizontal through the body region 12 and that portion of the extended drain 14 near the first surface 23, whereas the path is substantially vertical through the central portion of the extended drain. The distance a charge carrier travels through the extended drain is approximated by the dimension $L_3$.

Figure 2:
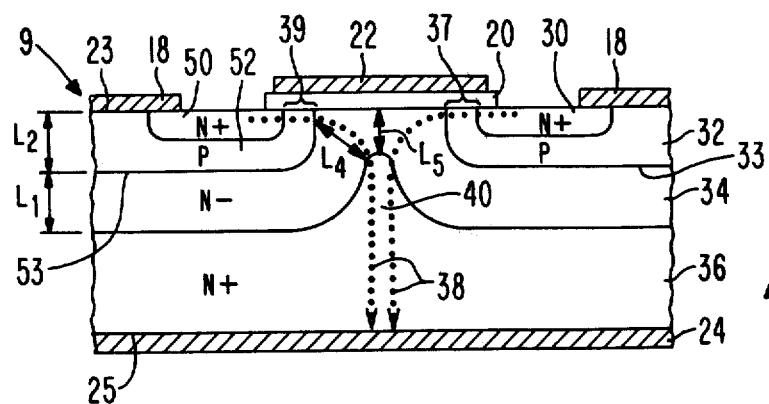
FIG. 2 is a cross-sectional view of a VDMOS device embodying the present invention.

Referring to FIG. 2, a preferred embodiment of a device 9 of the present invention is shown. The device comprises adjacent source 30, body 32, extended drain 34, and high conductivity drain 36 regions, with the body region 32 being of opposite conductivity type than the other specified regions. The source 30, body 32 and extended drain 34 contact the first semiconductor surface 23, and the high conductivity drain 36 contacts the second semiconductor surface 25. Source and gate electrodes (18 and 22, respectively) are on the first surface 23 (although the gate electrode is spaced from the surface by gate oxide 20) and a drain electrode 24 is disposed on the second surface 25. Channel 37 is created when a suitable voltage is applied to the gate electrode 22. Distances $L_2$ and $L_1$ represent, respectively, the depth of the body region 32, and the vertical thickness of the extended drain 34 between the body 32 and high conductivity drain 36.

In the present invention the high conductivity drain 36 of device 9 is shaped so as to minimize the distance the current must flow through the relatively low conductivity extended drain 34. To achieve this, the high conductivity drain 36 includes a projection 40 extending toward the first semiconductor surface 23 in an area where the extended drain 34 contacts the first surface. The projection is spaced from the first surface by a distance $L_5$, and the distance charge carriers flow through the (low conductivity) extended drain 34 is approximated by $L_4$. It should perhaps be noted here, that in the preferred embodiment the projection 40 is located equidistant between two similarly shaped body regions. The gate 22 and gate oxide 20 which cover the channel 37 in body region 32 also extend across the extended drain 34 and cover a similar channel 39 in a second body region 52. The second body 52 is also similar to the body 32 in that it surrounds a source 50 at the first surface, and forms a PN junction 53 with the extended drain 34.

The optimal design value for distance $L_5$ is determined by balancing device turn on resistance against source-drain breakdown voltage. Reduced turn on resistance occurs by reducing distance $L_4$ (in device 9) to a value below $L_3$ (in device 8). A reduced $L_4$ can be achieved by minimizing $L_5$ (i.e., by providing a greater projection 40). However, breakdown voltage is sacrificed when $L_5$ is reduced to below the value of $L_1$. Additionally, if $L_5$ is less than $L_1$, should breakdown occur it will occur in the extended drain region between the projection 40 and the first surface 23, a highly undesirable location, as explained herein.

The breakdown voltage of the device 9 is regulated by the thickness of the depletion region which extends from the body-drain PN junctions 33 and 53 into the extended drain 34. The greater the depletion region thickness, the greater the reverse bias voltage that can be sustained. In the present invention, the depletion region created in the extended drain 34 extends beneath the gate oxide 20 as well as beneath the body regions 32 and 52 in the bulk of the wafer. Should breakdown occur, it is desirable that it occur in the bulk rather than beneath the gate. This is because breakdown beneath the gate would cause avalanche injection of charge carriers into the gate oxide 20, changing the oxide characteristics, and possibly causing device destruction.

Thus, minimum turn on resistance occurs when $L_5$ is minimized, and breakdown considerations mandate that $L_5$ be greater than $L_1$. Balancing these two factors yields an optimal device design when $L_5$ is substantially equal to (or slightly greater than) $L_1$. That is, the extended drain 34 should provide substantially uniform spacing between the body regions 32 and 52 and the high conductivity drain region 36.

Figure 3:
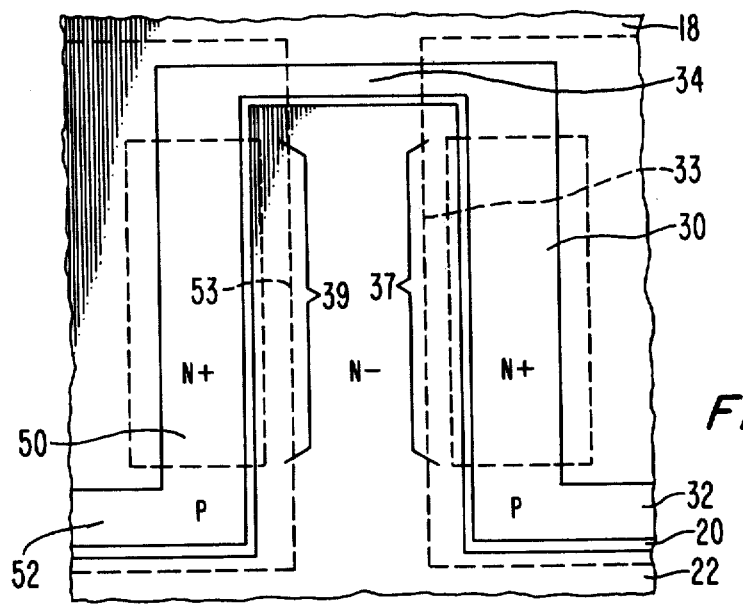
FIG. 3 is a top view of a VDMOS device embodying the present invention.

Referring to FIG. 3, a top view of a typical geometry for a segment of the first semiconductor surface 23 of device 9 is shown. It should be emphasized that this merely represents one possible embodiment. Many other configurations are possible while still remaining within the scope of this invention.

On the first semiconductor surface, a generally rectangular gate electrode 22 is located equidistant between the fingers of a generally rectangular source electrode 18, yielding an interdigitated electrode structure (which might typically be repeated across the semiconductor surface). FIG. 3 illustrates a unit cell of an interdigitated structure.

The first surface intercepts of the various regions within the semiconductor are represented by dashed lines. In this interdigitated structure, a plurality of congruent, generally rectangular body regions are matrixed on the first surface. The body regions 32 and 52 are spaced from each other by the extended drain region 34 which adjacently surrounds and forms a PN junction (33 and 53, respectively) with each body region. Within body 32 is a generally rectangular (at the first surface) source region 30. Within body 52 is a generally rectangular (at the first surface) source region 50. Source 30 is located such that at least one of its edges is spaced from the extended drain 34 (i.e., PN junction 33) so as to define channel 37 in the body 32. Source 50 is similarly located within body 52, so as to define channel 39 (in body 52) which is parallel to and the same length as channel 37 (in body 32). The two channels are separated by the extended drain region 34. A single gate (comprising an electrode 22 and oxide 20) is disposed over both channels and the extended drain which separates them. The interdigitated source electrode 18 is spaced from the gate electrode, and contacts a body/source interface in each body region. The drain electrode contacts the high conductivity drain on the opposite semiconductor surface (not shown in FIG. 3). The projection 40 of the high conductivity drain 36 comprises a volume of semiconductor material beneath the first surface which is substantially parallel to, the same length as, and equidistant from the two channels (37 and 39) it lies between.

A device embodying the projection can be fabricated by methods commonly known in the semiconductor industry. For example, after epitaxially growing an extended drain layer on a substrate (of high conductivity drain material), a projection can be formed by appropriately masking and diffusing an additional quantity of a similar conductivity modifier. An additional layer of extended drain material can then be epitaxially grown, followed by the previously mentioned double diffusion of body and source regions.

The present invention thus provides a readily manufacturable VDMOS device having reduced turn on resistance.

What is claimed is:

1. A VDMOS device comprising a semiconductor wafer having first and second major planar surfaces, and including therein:
   a source region of a first conductivity type adjacent to a body region of a second conductivity type, both regions intercepting the first major surface,
   a high conductivity drain region of the first conductivity type, intercepting the second major surface, and
   an extended drain region of the first conductivity type adjacently disposed between the high conductivity drain and body regions, and intercepting the first major surface so as to define a channel region in an area of the body region at the first surface, said extended drain region being of lower conductivity than the high conductivity drain region and providing substantially uniform spacing between the body and high conductivity drain regions, the high conductivity drain region comprising a projection extending toward the first surface in an area where the extended drain intercepts the first surface.

2. A device of claim 1 further comprising:
   a body region surface intercept of generally rectangular shape, and
   a source region surface intercept of generally rectangular shape within the body region.

3. A device of claim 2 further comprising:
   a channel region in an area of the body region between the source region and extended drain region, and
   a gate disposed on the first surface corresponding to the channel region.

4. A device of claim 3 wherein:
   the gate comprises a gate electrode disposed on an oxide layer.

5. A device of claim 4 further comprising a second body region including a source region and channel region therein, wherein:

the channel region in the first body region is separated from the channel region in the second body region by the extended drain region, and the gate is further disposed on the channel in the second body region and on the extended drain region which separates the channel in the first body from the channel in the second body.

6. A device of claim 5 wherein:

a source electrode contacts the source and body regions on the first surface, and a drain electrode contacts the high conductivity drain region on the second surface.

7. A device of claim 6 wherein:

the high conductivity drain region projection lies between the channel in the first body and the channel in the second body.

8. A device of claim 7 wherein:

the first conductivity type is N and the second conductivity type is P.

9. In a VDMOS device which comprises a planar semiconductor wafer having first and second major surfaces, source, body, and extended drain regions disposed in seriatim at the first surface so as to define a channel region in the body region at the first surface, and a high conductivity drain region adjacent to the extended drain region and coplanar with the second surface, the improvement comprising:

the high conductivity drain region including a projection towards the first surface such that the high conductivity drain region is substantially uniformly spaced from the body region.

* * * * *